United States Patent [19]

Berkovitz et al.

[11] Patent Number: 4,458,362
[45] Date of Patent: Jul. 3, 1984

[54] AUTOMATIC TIME DOMAIN EQUALIZATION OF AUDIO SIGNALS

[75] Inventors: Robert A. Berkovitz, Cambridge, Mass.; Ronald P. Genereux, Woonsocket, R.I.

[73] Assignee: Teledyne Industries, Inc., Los Angeles, Calif.

[21] Appl. No.: 378,009

[22] Filed: May 13, 1982

[51] Int. Cl.³ .............................................. H03G 5/00
[52] U.S. Cl. .................................... 381/103; 381/101; 333/28 T
[58] Field of Search ..................... 179/1 D; 333/28 T; 455/618; 375/12, 13; 381/98, 101, 102, 103

[56] References Cited

U.S. PATENT DOCUMENTS

| | | | |
|---|---|---|---|
| 3,732,370 | 5/1973 | Sacks | 179/1 D |
| 4,027,258 | 5/1977 | Perreault | 375/12 X |
| 4,118,601 | 10/1978 | Yeap | 179/1 D |
| 4,224,482 | 9/1980 | Lese et al. | 455/618 X |
| 4,291,411 | 9/1981 | Müller et al. | |
| 4,306,113 | 12/1981 | Morton | 179/1 D |
| 4,316,060 | 2/1982 | Adams et al. | 179/1 D |
| 4,340,778 | 7/1982 | Cowans et al. | 179/1 D |
| 4,340,780 | 7/1982 | Odlen | 179/1 D |
| 4,389,623 | 6/1983 | Onishi et al. | |
| 4,392,022 | 7/1983 | Carlson | |

OTHER PUBLICATIONS

Stanley A. White, "A Corrector for Nonlinear Amplitude Distortion of Speech", Conference: Proceedings of the 1981 Conference on Crime Countermeasures, Lexington, Kentucky, May 1981, pp. 111-115.

M. R. Schroeder, "Binaural Dissimilarity and Optimum Ceilings for Concert Halls: More Lateral Sound Diffusion, vol. 65(4), *Journal of the Acoustical Society of America*, Apr. 1979, pp. 958-963.

L. J. Griffiths, "Rapid Measurement of Digital Instantaneous Frequency," vol. ASSP-23, IEEE Transactions on Acoustics, Speech & Signal Processing, Apr. 1975, pp. 207-222.

M. Karnaugh, "Automatic Equalizers Having Minimum Adjustment Time," IBM J. Res. Develop., vol. 17, No. 2, Mar. 1973, pp. 176-177.

*Primary Examiner*—A. D. Pellinen
*Assistant Examiner*—Keith E. George
*Attorney, Agent, or Firm*—Schiller & Pandiscio

[57] ABSTRACT

This disclosure concerns an equalizer for an audio reproduction system in which equalization is achieved using a discrete time filter. The filter is preferably implemented with a microprocessor programmed for generating and storing the filter coefficients in accordance with a perceived acoustic test signal reproduced by the system. Following generation and storage of the coefficients, the microprocessor also serves to equalize an input audio signal by convolving the stored coefficients with digitized time samples of the audio input signal.

32 Claims, 17 Drawing Figures

SUBROUTINE A

AUTOMATIC TIME DOMAIN EQUALIZATION OF AUDIO SIGNALS

The present invention relates generally to sound reproduction apparatus, and more particularly to an audio equalizer system for providing spectral accuracy in the reproduction of acoustic signals as from a recording or broadcast, such accuracy constituting a primary criterion of quality in sound reproduction.

It has long been recognized that the transfer function of each component (such as tape recorders, loudspeakers, turntables, broadcast receivers) of a high fidelity system should be uniform over the entire audio frequency range from about 20 to 16,000 Hertz. Unfortunately, the performance of even the finest system assembled from the finest components may be severely degraded by wave interference effects caused by the boundaries of the typical listening room. This is especially true at frequencies below about 1000 Hertz, a range including all of the bass tones and most of the voice and fundamental component frequencies of musical sounds. Acoustic radiation from a loudspeaker system also varies in its spectrum with azimuth and elevation of the axis of radiation due to the finite size of the individual loudspeakers used and the geometry of multiple loudspeaker placement.

In the course of the design of loudspeakers, the performance of prototypes is normally monitored by positioning a test microphone directly in front of the loudspeaker in a test room where all reflections from the walls, floor and ceiling of the test room are suppressed. The result is a "pure" but somewhat unrealistic measurement, since listeners normally do not sit directly in front of one loudspeaker at a distance of one meter, nor do they listen in reflection-free rooms. Because most loudspeaker manufacturers advertise results obtained in such a test chamber, music listeners are led to believe that they may expect such performance from a purchased loudspeaker when it is brought home.

In the time it takes for a typical musical note to start and finish in music of moderate tempo (about one-tenth of a second), the sound waves will have been reflected many times from the boundaries of a typical listening room. Because of the wave characteristics of sound and the different arrival times at the listener's location, the reflections interfere, producing irregularities in the perceived frequency response of a sound reproduction system. These irregularities strongly influence the apparent timbre or tone quality of the reproduced sound.

Systems designed to compensate or correct for undesired amplitude-frequency response of a sound reproduction system with respect to a given environment are known as equalizers. More precisely, an equalizer is a device which alters the transfer function of one part of a system to compensate for errors in the transfer function of another part of that system; although the parts of the system may have non-uniform individual transfer functions, the overall performance of the system is thus improved. Such equalizers have heretofore generally operated by increasing or decreasing the gain in different fixed frequency bands. For example, the prior art early included equalizing systems which typically radiated a band of white or pink noise into the listening environment and detected that noise with a microphone. The detected signals were then fed to a sound level meter through band-pass filters each of which defined a band of audio frequencies, often one or more octaves per band. The operator then generated a plot of amplitude versus frequency over the entire audio spectrum and adjusted the filters accordingly to obtain a uniform acoustic output in each frequency band. This technique necessitated the adjustment and readjustment of individual filters many times in order to balance the system, creating an excessive expenditure of time and cost in professional applications and inaccuracies in equalization in consumer equalizers.

This basic system was improved by using a noise source which provided a comb of spectral frequencies in the audio range as disclosed for example in U.S. Pat. No. 3,732,370.

In another presently available equalizer system, a pink noise electrical signal is fed into a loudspeaker and converted to sound for detection by a microphone placed at an appropriate listening location. The output signal from the microphone is then examined or analyzed to determine the total energy content in each of several octave-wide, fixed frequency bands of the sound radiated by the loudspeaker. The energy measured in each such frequency band is then compared automatically to the energy in the comparable frequency band in the electrical input audio signal to the loudspeaker, to produce correction signals. The latter are then employed to set the parameters of a set of physical, bandpass filters with fixed center frequencies, the set being disposed in the electrical signal input circuit to the speaker. The gain in each band is adjusted to make the final output uniform from band to band. After passing through the filters, the separated signal components, now equalized, are combined to reconstitute the original but improved signal.

It will be appreciated immediately that this system, in common with all of the other audio equalizer systems in the prior art, necessarily requires the use of a plurality of fixed frequency bands for signal analysis. Moreover, the number of bands provided and therefore the frequency range allocated to each band will be dictated by economic as well as functional considerations, limiting the accuracy of correction. The use of such conventional frequency domain equalization therefore creates a number of problems. First, the error or distortion within a given correction frequency band may be relatively narrow within the frequency range of the band (e.g. less than ⅓ octave). The correction applied by such a system is actually for the average deviation within that frequency band. The resulting filtering may thereby tend to undercorrect the actual error or fail to correct entirely equal and opposite errors which fall within the one frequency band. At best therefore, such frequency domain equalization provides only a rough approximation of the desired correctionn of the audio field.

These equalizing systems, intended for consumer use, in which all of the frequencies within each frequency band are boosted or attenuated in order to achieve the desired frequency response have the disadvantage of normally relying upon the listener's subjective determination as to what the desired frequency response should be, unless the consumer purchases additional and costly measuring equipment.

Most prior art equalizers are ordinarily unable to deal with anomalies smaller than ⅓ octave, and in many cases the limit is an octave. The frequency at which maximum correction occurs cannot be adjusted, but only selected instead from the set of fixed frequency bands that may be available to the user. These bands are usually logarithmically spaced, although the room anomalies sought to be corrected are linearly spaced in the frequency domain. In order to obtain what the prior art considered precision equalization (e.g. to about ⅓ octave at best), spectral analysis was required, adding substantially to the cost.

Changes in listener position relative to the speaker system or room boundaries, require corresponding changes in equalization. Such changes are difficult and time-consuming even with equalization systems based upon spectral analysis. Of course, equalization systems without spectral analytic capability cannot detect the results of such changes in listener position and are unable to remedy spectral errors caused by interaction of the rooom geometry and changed listener or loudspeaker system placement.

Equalizing systems operating in the frequency domain generally require a physical or analog filter (i.e. one made of the usual capacitors, resistors and/or inductors) for each frequency band examined. Because the band edges cannot be made infinitely steep, the settings of each necessarily affects the settings of the others, so that the process of adjusting all of the filters optimally is lengthy and difficult.

In addition, high frequencies are radiated from loudspeaker systems generally into a narrower solid angle than are low frequencies. If the loudspeaker system has a flat frequency response on axis, the high frequency energy arriving at the listener typically falls off with increasing frequency due to a combination of directionality effects and absorption at room boundaries and by room furnishings. Attempts to equalize the sound at that point by increasing the amplitude of the signal in that solid angle to compensate for energy lost by absorption, will generally result in an unnatural balance. In other words, while current equalization systems have some utility in equalizing the totality of direct and reverberant sound as perceived by the listener at some predetermined location, they are generally quite incapable of correctly equalizing the direct and reverberant aspects separately.

Another serious failing of prior art equalization in the frequency domain may be understood by referring to the conventional representation of three stages of sound presentation in a reverberant room, as may be found in many textbooks on acoustics. These three stages consist of (1) the reverberant onset, during whic direct radiation from the loudspeaker combines with reflected sound arriving from the room boundaries so that the measured sound level at the listener's location is gradually increasing; (2) the equilibrium state in which the energy measured at the listener's location is level; and (3) reverberant decay which occurs after the cessation of sound output from the source. Because typical rooms, both large and small, tend to absorb high frequencies more than low frequencies, the duration of the onset period and the level reached during the equilibrium stage are both smaller for high frequencies than for low frequencies. The effect of conventional analog frequency domain equalization is best understood by reference to FIG. 1 which shows the result obtained by adjusting the input level of the signal fed to the loudspeaker on the basis of equalization test measurements made with a pink noise signal in equilibrium with the room as is the standard procedure followed almost universally by those engaged in the correction of room acoustic anomalies by frequency domain multi-band equalization.

It will be seen in FIG. 1 that increased input at high frequencies by an amount calculated to assure equality of level in the equilibrium state (during which the test of the system is made), will lead to a severe anomaly during the onset period. The duration of such anomaly is directly related to the onset time of the room or, more correctly, to the difference between onset times at high and low frequencies and the overall onset time characteristic. The nature of the anomaly is such that early arriving sound at the listener's location will contain far too high an amount of high frequency energy. One consequence of the anomaly is that transient signals, such as the attack occurring at the initial sounding of a musical instrument, will have too much high frequency energy, distorting the sound quality and seriously affecting the perceived realism of reproduced sound. Without doubt, this effect is a major contributor to the perceived excess of high frequencies usually observed when a sound system in a large room is equalized to have a uniform response at the equilibrium stage. Professional engineers engaged in such equalization thus normally reduce the high frequency output of the equalizer after achieving what has been measured as a "proper" correction.

The present invention is intended to overcome the foregoing problems through a relatively inexpensive, novel equalization system that directly synthesizes the required filter in the time domain, without need for either measurement or computation of the system transfer function or power spectrum. The filter synthesis is accomplished without requiring any technical knowledge or skill on the part of the system user. The correction achieved by such filter can be precise within a bandwidth of as small as 1/100 octave or even smaller. Through the novel equalization system, one can separately correct for the early or later components of the sound radiation reaching the listener. The invention, in sum, solves acoustic problems that heretofore have been considered beyond the control of sound engineers.

Of particular interest is that through use of the equalization system of the present invention relatively moderately priced loudspeakers designed for use by consumers can be made to outperform elaborate and costly studio monitor loudspeaker systems in terms of the uniformity of spectrum delivered to a listener, even when such expensive loudspeaker systems have been provided with typical prior art equalization.

A primary object of the present invention is therefore to provide an improved audio equalization system. Particularly, an object of the present invention is to provide an equalization system operating in the time rather than the frequency domain, thereby permitting solution of a number of the problems found in the prior art.

Yet other objects of the present invention are to provide an equalizing system in which the equalizing filter means includes a filter operative in the time domain; to provide such a system in which the filter is a discrete-time filter; to provide such a filter means which includes a digital computer programmed to generate coefficients for a discrete-time filter to be used for equalizing the perceived acoustic output of a sound reproduction system including an electroacoustic transducer disposed in a predetermined location in a particular environment; to provide such a filter means in which the digital computer is also programmed to perform discrete-time filtering of the electrical audio-frequency signals intended to be equalized, all in accordance with the coefficients previously generated; to provide such a filter means which can readily correct for acoustic anomalies which are linearly or irregularly spaced in the frequency domain; to provide such an equalizing system in which the digital computer is programmed to design matched filters to thereby alter the spectrum of an input signal to approximate that of a selected reference signal; and to provide such an equalizing system which can correct selectively the direct or reverberant portions of the sound at a predetermined location in a particular environment in which the sound reproduction system is disposed.

Yet another object of the present invention is to provide time-domain equalization which does not create an anomaly in reproduction related to the onset time of the room in which reproduction takes place, and therefore makes possible the rendering of natural and accurate augmentation of sound level.

Accordingly, these and other objects of the present invention are achieved by apparatus for modifying the audio response of a sound reproduction system, particularly in the form of an improved audio equalizer comprising a discrete-time filter connected in the sound reproduction system. Means are provided for introducing an electrical test signal into a first point in the sound reproduction system, typically at the input of an elctroacoustic transducer. Means, such as a microphone, are provided for detecting at a predetermined location the acoustic output produced by the transducer of the sound reproduction system in response to the test signal. The equalizer includes means for generating a sampled sequence of signals from the detected acoustic output of the sound reproduction system. Means are provided for generating from the sequence of signals, coefficients of the discrete-time filter and the tap locations or time slots of the respective coefficients. Means are also included for storing those coefficients and time slots or locations in appropriate order together with the addresses at which they are stored.

Before describing preferred embodiments of the invention, as an aid toward full understanding of the invention it is believed desirable to define a number of terms used in the description herein. Particularly, the term "sound reproduction system" is intended to be construed broadly enough to include a system embracing a signal path between means which detects the original audio signal to be reproduced and the ultimate listener, at least part of that path being an electrical signal channel. It will be apparent that this definition is intended to include, as part of the total signal path, typical components such as recording and broadcast apparatus, turntables, pick-up cartridges, tuners, amplifiers, loudspeakers and other components that affect the signal transmission along the path, as well as other elements such as recording and broadcast media and the enclosure into which the final reproduced sonic pressure waves are radiated.

The term "discrete-time filter" is intended to refer to a finite impulse response (FIR) filter whether digital or analog in structure and operation. Such a discrete-time filter is typified by a tapped delay line in which the signal level from each tap is weighted by some predetermined value, for example of an output resistor in analog filters of this type.

In a preferred embodiment, the means for generating the coefficients and tap locations of a finite impulse response filter is conveniently a digital computer programmed to convolve the digitized, perceived test signal with a target spectrum signal to generate the filter coefficients and tap locations. The target spectrum may be that of the detected signal itself, in which case the convolution is akin to an autocorrelation function, or can be some other target spectrum which may or may not be functionally related to the test signal, in which instance the convolution is akin to a cross-correlation function. A preferred convolution operation is one which generates discrete-time filter coefficients and time locations on the basis of the detected acoustic output of the sound reproduction system, using an adaptive least mean square error algorithm.

In a preferred embodiment, a communications link is provided between the output of the microphone means and the input of the means for generating the time-sampled sequence of signals. This communications link is preferably electro-optical and includes manually operable means coupled to the microphone means and communications link for initiating generation of an optical carrier. The means for providing the test signal is actuated to provide the test signal responsively to detection of the optical carrier by a sensor connected to the sound reproduction system.

In yet another preferred embodiment, the means for generating the time-sampled sequence includes time-sampling means and an analog-to-digital converter. Switching means are provided for alternatively connecting the input of the time-sampling means between (1) a source of signals to be equalized by the equalizing system, and (2) the communications link to receive signals transmitted from the output of the microphone means. Means are also provided operative initially upon provision of the test signal, for actuating the switching means so as to connect electrical signals from the communications link to the input of the time sampling means, and operative after generation and storage of the coefficients and time locations, for actuating the switching means so as to connect the source of signals to be equalized to the input of the time-sampling means, the digital computer means being also programmed to then convolve the stored coefficients at their respective time locations with digital signals received from the time-sampling means, thereby linearly filtering such digital signals to achieve equalization. It is important to note that the time locations of the coefficients are not necessarily contiguous with one another but may be irregularly spaced apart in time. Such coefficients and their relative location in time (i.e. their time locations) will be in the specification and claims hereinafter referred to simply as coefficients or set thereof, and it will be seen that such set defines the impulse response of the filter.

Other objects of the present invention will in part be obvious and in part appear hereinafter. The invention accordingly comprises the method comprising the several steps and relation and order thereof, and the apparatus possessing the features, properties and relation of elements, all of which are exemplified in the following detailed disclosure and the scope of the application of which will be indicated in the claims.

For a fuller understanding of the nature and objects of the present invention, reference should be had to the following detailed description taken in connection with the accompanying drawings wherein.

Figure 6:
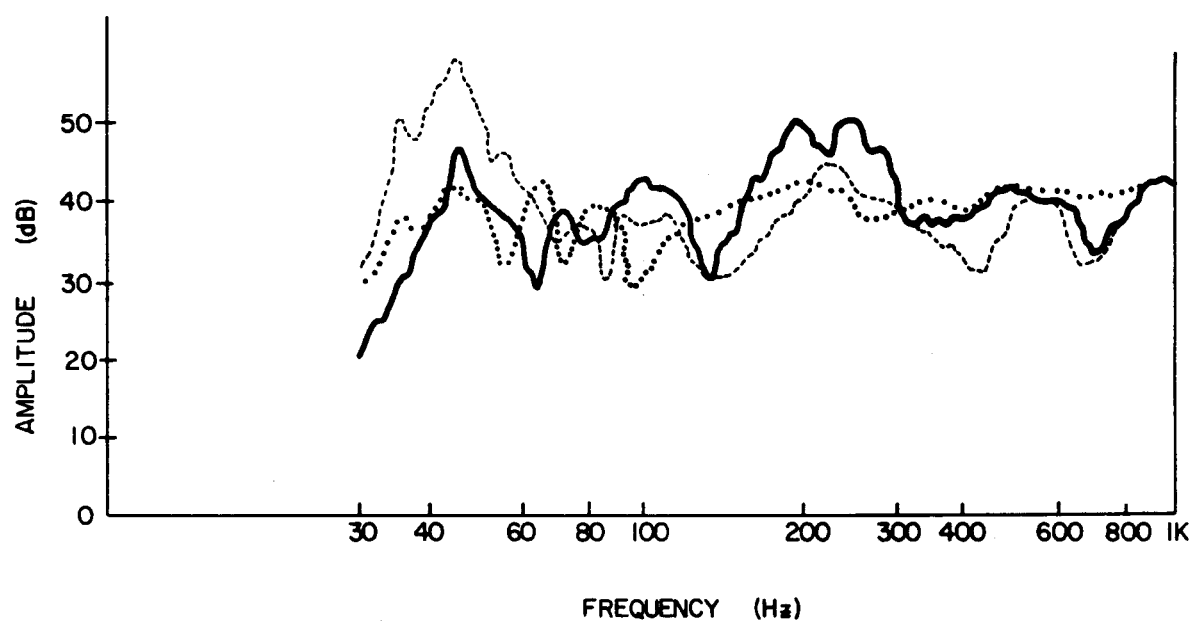
Figure 7B:
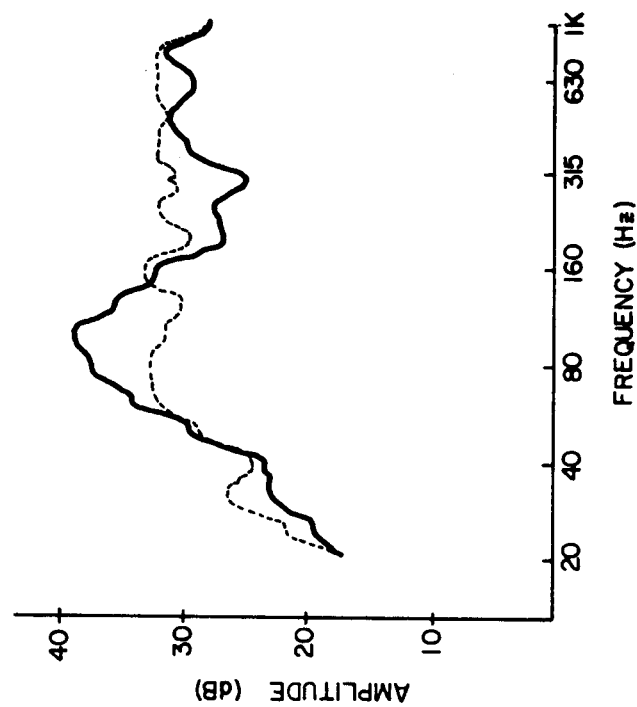
Figure 7A:
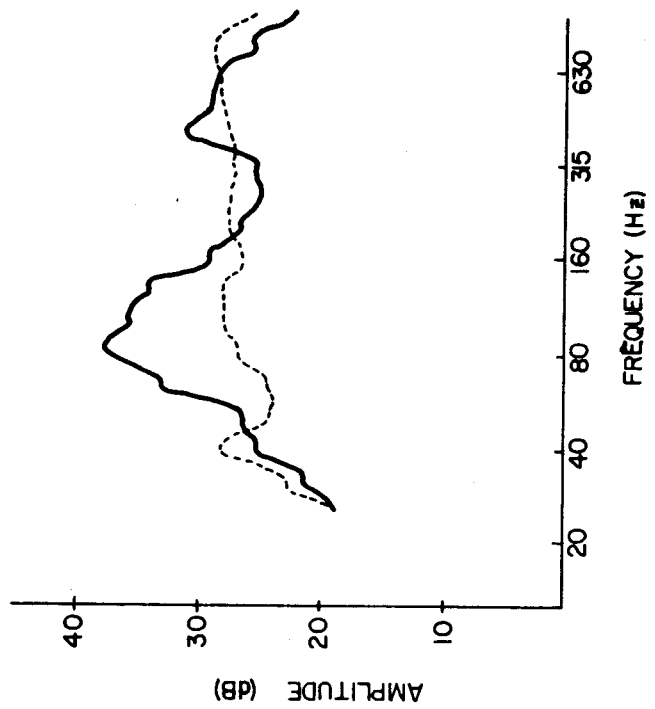
Figure 7C:
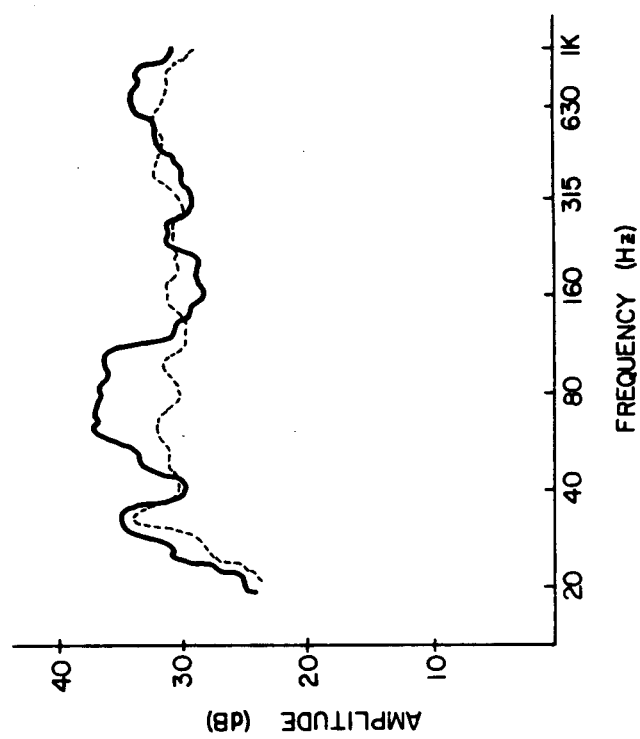

FIG. 6 is a graphical representation on a log-log scale of amplitude vs. frequency of perceived acoustic signals as equalized by the system of the present invention compared to a prior art equalization system applied to a relatively high cost loudspeaker system; and FIGS. 7A–7C are a group of graphical representations on a log-log scale of amplitude vs. frequency showing application of the present invention in equalization of several different currently available loudspeaker systems.

Figure 1:
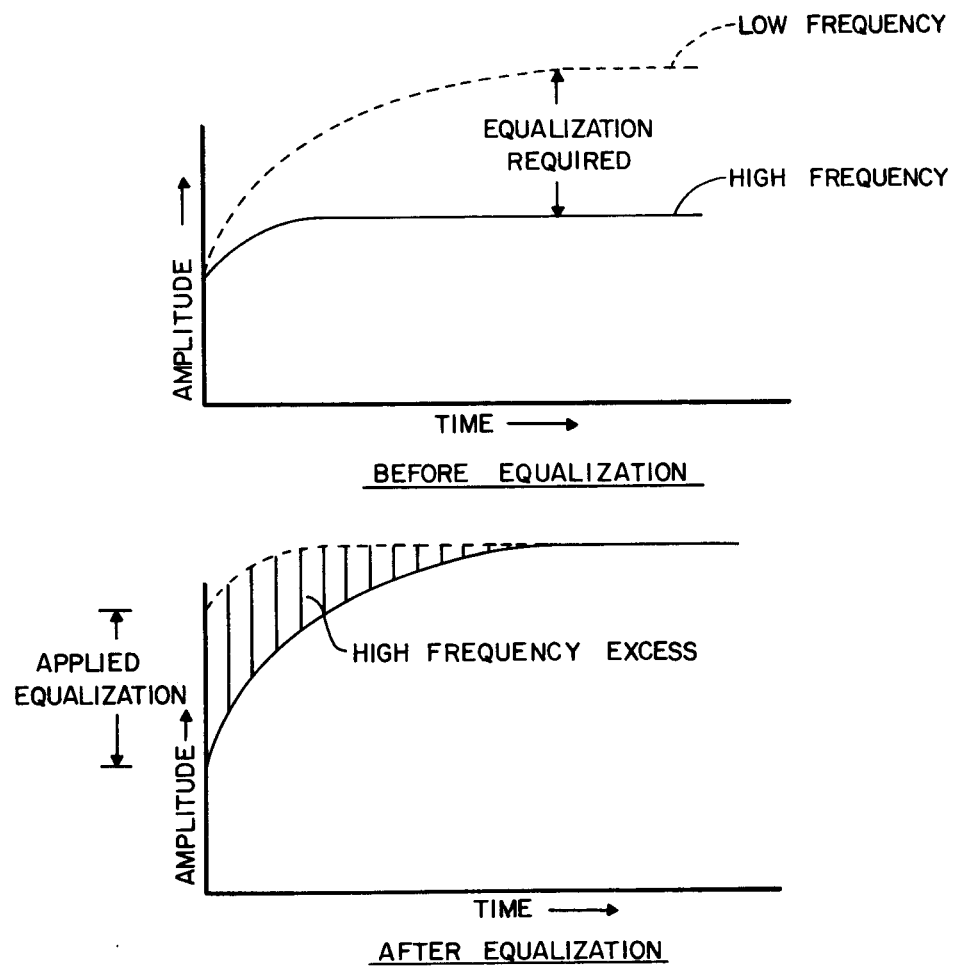
FIG. 1 shows time/energy diagrams illustrating a problem in prior art equalization with respect to high frequency content during reverberant onset.
Figure 2:
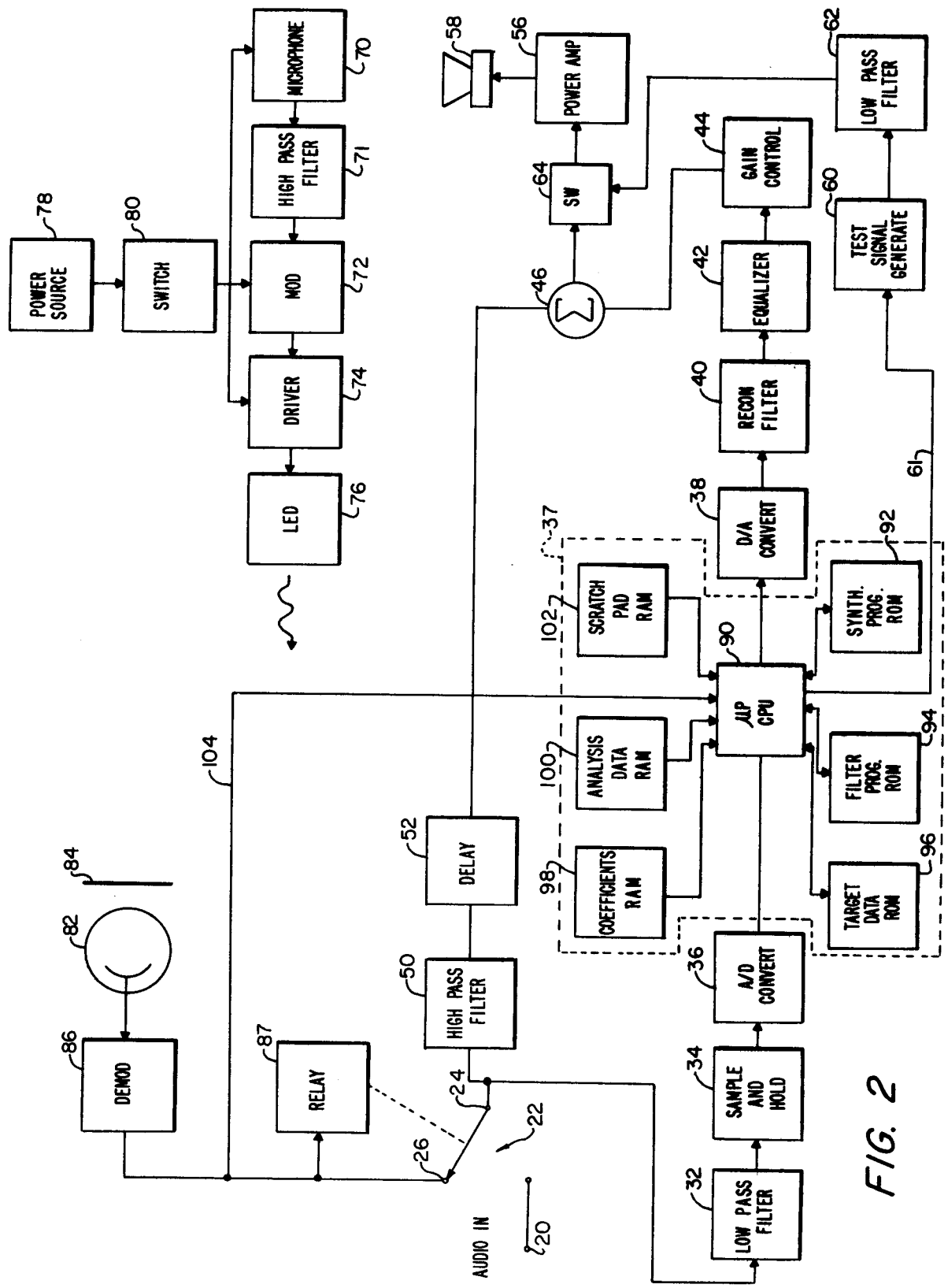
FIG. 2 is a block diagram showing a combination of elements embodying the principles of the present invention.

Referrring now to FIG. 2, there is shown an equalizing system of the present invention embodied for the sake of illustration only, in a single audio channel system, it being understood that the principles of the present invention are equally applicable to multichannel systems such as stereophonic systems. The embodiment of FIG. 2 comprises input terminal 20 at which an audio signal to be equalized is applied, typically from a preamplifier or the like. Terminal 20 is couplable, through operation of switching means 22, to input terminal 24 of an equalizing circuit. Alternatively, terminal 24 can be connected through operation of switching means to terminal 26. Terminal 24 is connected to two parallel channels, one a high frequency path, the other providing a path for low frequencies for which equalization is to be provided. Typically, the bandwidth of the low frequency path is about 20 to about 1000 Hz inasmuch as the major anomalies in room acoustics occur within this frequency range, but it is to be understood that the invention is not limited to any particular bandwidth and can be applied, for example, to the entire broadband audio input spectrum to the system. The low frequency path therefore includes an appropriate low-pass signal filter 32 having its input connected to terminal 24. Filter 32 serves as an anti-aliasing filter, attenuating signal components above the Nyquist frequency to insure that no aliasing errors occur during the sampling process. Low-pass filters are well known in the art and need not be described further herein.

The output of filter 32 in turn is connected to the input of sample-and-hold circuit 34, a well known analog signal storage device which permits readout and storage of a value $x(t_1)$ of a variable voltage $x(t)$ at a specified sampling time $t_1$. Typically the latter can be a Model SHC 298 AM currently obtainable from Burr-Brown Research Corporation, Tucson, Ariz. The output of sample-and-hold circuit 34 in turn is connected to the input of analog-to-digital converter 36, the latter typically being an AD 574 integrated circuit obtainable from Analog Devices of Norwood, Mass. The output of converter 36 is connected as a data input of microcomputer circuit 37 which is basically a microprocessor with memory. Circuit 37 can be a digital computer as will be described for purposes of illustration herein. The central processor unit 90 and a random access memory of circuit 37 are exemplified by a TMS 9995 chip obtainable from Texas Instruments of Dallas, Tex. The ancillary parts and operation of circuit 37 will be described later here. After processing of data in circuit 37, the processed digital signals are fed to digital-to-analog converter 38, for example a Model DAC 80 from Burr Brown Research Corporation. The output of converter 38 is connected to the input of low-pass reconstruction filter 40 which serves to remove high frequency components introduced in the reconstruction of the digital signals to analog signals by converter 38. The output of filter 40 is connected to amplitude equalizer circuit 42, the latter serving to correct the rolloff introduced by converter 38. Gain control circuit 44 is connected to control the amplitude of the output signal from circuit 42 and may be designed to provide a fixed gain, or to be user-adjustable or to be under the control of microprocomputer circuit 37. Lastly, the low frequency channel terminates by connection of the output of gain control circuit 44 to the input of analog summing device 46, typically a well-known operational amplifier.

The high-frequency channel is formed of high-pass analog filter 50 having its input connected to terminal 24 and its output connected to delay equalization circuit 52. The latter typically is an all-pass, active filter designed to have a phase response which complements that of the low pass channel. The output of circuit 52 is connected as another input to summing device 46. The output of the latter is connected through power amplifier 56 to the drivers of loudspeaker system 58.

For purposes of providing a test signal, the apparatus of FIG. 2 includes test signal generator 60, for example a well known white noise generator, for providing a signal over a wide bandwidth with a constant power spectrum. Alternatively, generator 60 may be a circuit including a digital-to-analog converter and reconstruction filter, for generating a test signal from digital data or test spectrum, typically stored for example in a memory device within microcomputer 37. Generator 60 may be manually turned on and off, but in a preferred form is electrically coupled (as shown by lead 61) to microcomputer 37 so that the generator can be turned on and off on command from the microcomputer. The output of generator 60 is connected to the input of low-pass filter 62 which serves to remove unwanted high frequency components, typically those above 1000 Hz for this embodiment. The output of filter 62 is connectable to the input to power amplifier 56 by switching means 64 operable in tandem with switching means 22 by relay 87, as will be hereinafter described.

As means responsive to the test signal provided by generator 60 and reproduced as an audible signal by speaker 58, the apparatus of FIG. 2 also comprises microphone 70, the output of which is coupled to the input of high pass filter 71 which serves to remove extraneous noise. The output of filter 71 is connected to the input of modulator circuit 72. The latter, of known type, includes typically an oscillator to establish a carrier frequency higher than the bandwidth over which equalization is to occur. In circuit 72, the microphone output signal typically is used to modulate the carrier signal from the oscillator i.e. in frequency, amplitude, pulse width or the like. The modulated electrical signal is then introduced into power circuit 74, the output of the latter being coupled to drive light-emitting diode (LED) 76 to follow the modulations of the signal from modulator circuit 72. LED 76 preferably, for purposes of the present invention, emits in the infra-red. Of course, other modulation schemes, well known in the art, may also be used. It will be apparent that the combination of microphone 70, modulator circuit 72, driver circuit 74 and LED 76 serve to detect and convert the acoustical signals received by microphone 70 into corresponding light signals radiated by LED 76 within a narrow light frequency range. Power source 78 is connectable through manually operable switch means 80 for powering microphone 70 and circuits 72 and 74. The entire ensemble of microphone 70, circuits 72 and 74, LED 76, power source 78 and switch 80 are preferably packaged as a unit physically independent of and unconnected with any of the other equipment, so as to be capable of being hand-held and carried about a room to any desired location by a listener.

The apparatus of FIG. 2 further comprises photoelectric detector means 82 capable of being responsive to light emitted by LED 76, typically by having a spectral response to only light within the frequency range generated by LED 76. Such selective response can readily be obtained, if desired, by an appropriate light filter 84 to screen photoelectric means 82. The output of the latter is connected to known demodulator circuit 86 which serves to demodulate or to recover the original electrical signal (or a signal proportional thereto) generated by microphone 70. The output of demodulator circuit 86 is connected to terminal 26. The latter in turn is connectable to terminal 24 by operation of switch 22 which, although the latter may be manually controlled, in the preferred embodiment is operable by a relay 87 responsive to an initial signal from demodulator 86. Relay 87 is typically of the type which, after a predetermined delay, opens and permits switch 22 to return to its normal position wherein terminal 24 is connected to terminal 20. As earlier indicated, relay 87 also serves to operate switch 64 so that the output of filter 62 is respectively connected to the input of amplifier 56 and the output of amplifier 46 is disconnected from the input to amplifier 56 simultaneously with connection of terminal 24 to terminal 26.

It will be apparent to those skilled in the art, that while the provision of an electro-optical communications link between microphone 70 and terminal 24 is highly preferred as imparting great flexibility upon the system, in another embodiment such communications link may simply be in the form of electrically conductive wiring, thereby replacing the modulation/demodulation circuits with a sigle amplifier.

Microcomputer circuit 37 includes central processing unit 90 and a read-only memory (ROM), in general both erasable and programmable, exemplified by a TMS 2532 EPROM chip from Texas Instruments, Dallas, Tex. The read-only memory is divided into two or more sections. One such section is filter synthesis program ROM 92 for storing a program for analyzing an array of digital signal values which constitute the output of converter 36 when the test signal generator 60 is providing the acoustic input to the system, and for computing the digital values of the coefficients and tap locations of a finite impulse response filter. Another section is filtering program ROM 94 for storing a program which convolves the computed set of coefficients with the digitized samples of the audio signal provided at terminal 20. In the event that one wishes to include a target spectrum in the system, another section of the read-only memory may be added in the form of target data ROM 96 for storage of information or data desired to establish the characteristics of the test signal to be generated by generator 60. ROM 36 can be another TMS 2352 EPROM if desired. Microcomputer circuit 37 also includes random-access memory (RAM) means in the form of coefficients RAM 98 for storing the set of filter coefficients computed by CPU 90, RAM 98 typically being the memory included in the TMS 9995 integrated circuit above-identified. Circuit 37 also includes, in the form of TMS 4016 RAMs from Texas Instruments, analysis data RAM 100 for storing the samples of the digitized test signal received by microphone 70 and transmitted to terminal 24, and RAM 102, a type of scratch-pad memory for storing temporary data created during convolution operations or in operations performed in creating the filter.

In operation, to equalize loudspeaker 58 with regard to any desired location of a listener in a room containing the loudspeaker, it is first necessary to generate or compute an equalization filter. Thus, the listener disposes himself at that desired locale in the room and manually operates switch 80 to power LED 76, directing a light beam from LED 76 toward detector 82. Initially unmodulated radiation from LED 76 as detected by photoelectric detector 82 produces an initial signal which operates relay 87 to close switch 22 so as to connect terminals 26 and 24 and closes switch 64 to connect the output of test signal generator 60 to amplifier 56 and disconnect amplifier 46 from amplifier 56. The initial signal then serves to trigger over line 104, microcomputer 37 to initiate execution of the synthesis program and to initiate operation of generator 60 to generate its test signal or alternatively a signal having its samples stored in ROM 96, all resulting in the subsequent production of a corresponding acoustic test signal from speaker 58. That test signal, picked up by microphone 70 at the desired location and converted to an optical waveform, is transmitted on the optical link between LED 76 and photoelectric detector 82, converted back into an electrical waveform, and filtered in filter 32 to provide signals typically below about 1 kHz and introduced into sample-and-hold circuit 34. As earlier noted herein, the choice of a band-pass of from 20 Hz to 1 Khz is exemplary; the present invention is not particularly limited to any particular bandwidth, nor to the use of any specific input filters, although the major problems in equalization tend to occur with respect to signals below about 1 Khz. For example, the signal introduced into sample-and-hold 34 can be the full range of input audio frequencies, assuming that sample-and-hold circuit 34 possess an appropriate sampling rate. In such case, the system need not include filter 32, or for that matter the high frequency path established by filter 50 and delay circuit 52, inasmuch as microcomputer 37, if of sufficient capacity, can be used to accomplish the desired input filtering and crossover digitally. In this respect, it is apparent that additional arithmetic and/or memory units can be coupled to microcomputer 37 to increase the operating capacity of the latter, if desired.

Typically, the sampling rate of sample-and-hold circuit 34 is established by a clock (not shown), that sampling rate being a function of the repetition rate of the clock. The sampling rate, as well-known in accordance with the Nyquist criterion, must be at least double the highest frequency of interest. Thus typically a sampling rate of 2.5 kHz will sample an exemplary 20 Hz to 1 Khz audio frequency range passed by filter 32.

If the data signal introduced into sample-and-hold circuit 34 has any frequency components higher than half the sampling rate it cannot be accurately reconstructed subsequently by digital-to-analog converter 38. The sampling system will generate an aliased signal component, the frequency of which is the difference between the frequency of the original input signal component and the sampling rate or frequency. Thus, anti-aliasing filter 32 at the input of circuit 34 serves to attenuate very sharply any signal over half of the sampling rate. By using a higher sampling rate, one need not be concerned with having the filter roll off rapidly just above the maximum frequency of interest, and with a higher sampling rate, the anti-aliasing filter can be made relatively inexpensively and more importantly, will exhibit a relatively negligible phase shift.

The low-pass filtered electrical form of the test signal is then sampled in sample-and-hold circuit 34 to provide a sequence in time of analog samples of the signal amplitude, each sample having substantially the same time duration and separated in time from the others according to the sampling rate used. These analog samples are then fed to analog-to-digital converter 38 where the amplitude of each sample is translated or converted into a digital value, typically expressed as a binary number. The purpose of converting the samples to digital form is so that they can be processed by the digital techniques employed by microcomputer 37. The digitized samples are transferred to microcomputer 37 and initially sorted in analysis data RAM 100 under control of the program in synthesis program ROM 92.

In order to understand the operation of microcomputer 37, it is helpful to consider the operation of a discrete-time filter, of which one embodiment is a time-sampled signal, digital filter. Any linear network or system with input and output terminals can be characterized by describing its properties in terms of either the "frequency domain" or the "time domain". A "frequency domain" description of a system is one in which amplitude and phase of an output signal from the system are represented as a function of signal frequency. In the frequency domain, one does not deal explicitly with time functions but instead, for example, with Fourier or Laplace transforms and the like, which are functions of frequency. On the other hand, the "time domain" description is one in which the amplitude of the output signal of the system is represented purely as a function of time. Typically a time domain description is contained in the impulse response of the system to an input impulse which ideally is of infinitesmal duration and unit amplitude. It is recognized that the time domain and frequency domain systems are mathematically related, and typically one may be transformed into the other by known transformations. For example, in the frequency domain the transfer function of the network or system can be described as the Fourier transform of its impulse response.

In contrast to conventional equalizers which are designed according to frequency domain specifications, the present invention operates in the time domain, and employs discrete-time filter means specially adaptable for equalizing the sound arriving at a listener's selected location. The present invention samples the sound signals in the time domain, a process which translates them into numerical values, and then the latter are convolved with a set of predetermined filter coefficients. Methods of generally implementing digital filters are widely described in the literature and will not be dealt with here in minute detail except to gain an understanding of the invention. An excellent explanation of digital signal processing is entitled *An Introduction to Discrete Systems,* Kenneth Steiglitz, John Wiley Sons, New York, 1974.

A sampled and digitized signal of speech, music or any other time-varying quantity can be considered as a sequence of impulses of varying amplitude and polarity, the magnitude and polarity of any impulse corresponding to the magnitude and polarity of the original signal wave form at the exact time of sampling. Similarly, a digital representation of the impulse response of a filter, after the impulse response has been sampled and digitized, consists generally of a finite sequence of numbers, the numbers corresponding to amplitude during consecutive sampling periods, i.e. spaced equally apart in time. Each such number in the series bears a fixed proportional relation to the others. Any convenient numerical scale can be used to represent the filter impulse response, which is fully defined by this proportional relation. The absolute values of the numbers in the sequence are exactly proportional to the magnitude of the applied impulse, and it is common to assume in such descriptions that this magnitude has a numerical value of 1.0, with the impulse designated the unit impulse, $\delta$ (n), although clearly one can arbitrarily scale the numbers of the sequence. Convolution of a digital filter impulse response and a sampled, digitized signal will thus create a sequence of sums of scaled filter impulse response. The result of the convolution process is an output signal as described in the following exemplary way, simplified for purposes of exposition.

As is generally understood, the values of the filter impulse response need not correspond to the physical response of any existing analog filter or system, but can be simply any sequence of numbers designated a filter. It is therefore possible to create a digital filter which could not be synthesized with analog filter components, such as a sparsely populated filter i.e. one in which a section of the filter impulse response is zero. Reasons why such a filter is desirable will be discussed later herein.

When used to carry out discrete convolution as described hereinafter, the filter numbers are ordinarily referred to as "coefficients". A conventional mathematical expression for the convolution process, derives the final output signal values one at a time by summing the products of previous consecutive input signal values and the coefficients:

$$y(n) = \sum_{j=0}^{m-1} c_j x(n-j) \tag{1}$$

where
x(n) is the input signal to the filter at discrete time n,
m is the number of coefficients;
$c_j$ are the filter coefficients, i.e., the numerical values of the coefficients m of the filter impulse response;
j is an index from o to m, and
y(n) is the output signal from the filter.

Figure 3A:
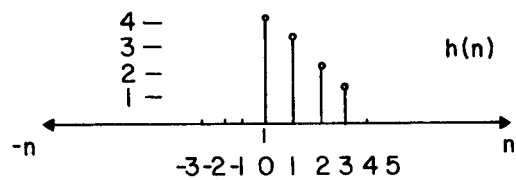
FIGS. 3A–3D are a graphical representation of a simplified convolution operation of a filter with a signal in digital form, according to the principles of the present invention.

By way of a simplified example of the operation of a program performing the equalization of a signal by convolving the digitized signal with a digital filter in accordance with equation (1), assume that the filter impulse response, h(n), which is desired to be convolved with a signal in order to filter the signal, has been designed to be a simple four point filter, and consists simply of the four integers 4, 3, 2 and 1 in that order as shown in the graph of FIG. 3a, and can be represented mathematically as $$h(n) = \sum_{i=0}^{3} c_i \delta(n - i) \quad (2)$$

where $c_0=4$, $c_1=3$, $c_2=2$ and $C_3=1$

Figure 3B:
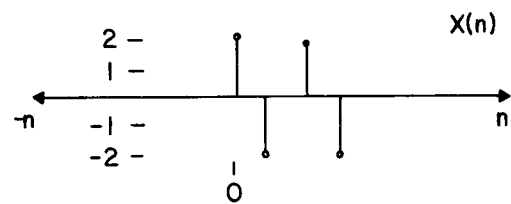

As shown similarly in FIG. 3b, the input signal x(n) for exemplary purposes here consists of the values 2 and −2, beginning at time zero and alternating for a long period of time, or $$x(n) = \sum_{k=0}^{\infty} (-1)^k 2\delta(n - k) \quad (3)$$

Figure 3C:
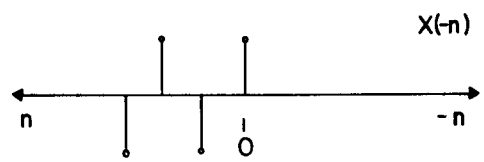
Figure 3D:
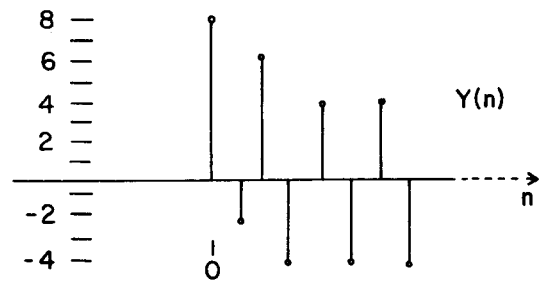

The three steps involved in carrying out numerical convolution are shifting, multiplication and addition, which together result in the synthesis of a new signal, the output signal. To perform the convolution graphically, the input signal of FIG. 3b is first time-reversed as shown in FIG. 3c i.e. if the input signal is x(n) then the time-reversed version thereof is x(−n). From equation (1) it can be seen that the first output sample $y(0) = c_0 x(0) + c_1 x(-1) + c_2 x(-2) + c_3 x(-3)$. Graphically, this is the equivalent of multiplying values of x(−n) by the corresponding values of h(n). This produces the values (4.2), (3.0), (2.0) and (1.0) or 8, 0, 0, 0 which when summed equals 8, the first computed output sample y(0) of the filtered signal. Next, the multiplication/addition procedure is repeated, but with the signal shifted in time one sample period, yielding $y(1) = c_0 x(1) + c_1 x(0) + c_2 x(-1) + c_3 x(-2)$. This produces the products −8, 6, 0, 0 which when summed equal −2, providing the second output sample y(1). The signal is shifted one more sample period and the products are 8, −6, 4, 0 providing a third sample value of y(2)=6. If this multiplication and shifted addition process is continued through sufficient interations, the result is a filtered output signal as shown in FIG. 3d, which exhibits an initial transient of values 8, −2, 6, and then settles into a steady state alternately taking the values −4 and 4 as long as the input signal continues. It will be apparent that because the filter coefficients are shown as contiguous for simplicity in exposition, no filter tap values need be explicitly used in the calculations in this example.

The method of time series analysis known as linear prediction is a technique which has been widely applied in speech analysis and synthesis, geophysics and other fields. A detailed review of the subject is given in a paper entitled "Linear Prediction: A Tutorial Review", by J. Makhoul, Proc. IEEE, Vol. 63, pp. 561–580, April, 1975. Although modern applications of the technique appear to have started with sunspot analysis by Yule around 1927, important components of the technique appear in the work of the 19th century German mathematician Gauss. Several well-known algorithms for implementing the linear prediction method have been published in the form of computer programs known as COVAR (covariance method) and AUTO (autocorrelation method), which provide analytical solutions (see J. D. Markel and A. H. Gray, Jr., "Linear Prediction of Speech," Springer-Verlag, New York, 1976). Adaptive methods of linear prediction are known which provide results closely approximating analytical conditions, but which can be more conveniently implemented in systems where low cost, simplicity and small size are important considerations. Cf. for example "Rapid Measurement of Digital Instantaneous Frequency" by L. Griffiths, IEEE Trans. Assp. Vol. ASSP-23, pp. 207–222, April, 1975. It is these types of adaptive methods which may be used to implement the preferred embodiments of the present invention.

One of the simplest of the many known algorithms that may be used for adaptive prediction of a set of filter coefficients is an adaptive least mean square error algorithm (the so-called LMS algorithm) developed by Widrow. The two equations which describe this algorithm are as follows:

$$e(n) = x(n) - \sum_{j=1}^{m} c_{j(n-1)} x(n - j) \quad (4)$$

$$c_j(n) = c_j(n-1) + 2 \mu e(n) x(n - j) \quad (5)$$

in which
e(n) is the error signal at discrete time n,
x(n) is the input signal at discrete time n,
$c_j$ are the filter coefficients,
$\mu$ is a scaling factor;
j is the index, and
m is the number of coefficients in the filter to be synthesized, and is chosen to provide sufficient resolution.

Equations (4) and (5) represent the following procedure: a filter is convolved as set forth in equation (1) with a sampled input signal, for a single iteration only; the result is taken as the error signal e(n), the difference between x(n) and its "predicted value" represented by the summation term in equation (4).

Equation (5) represents the subsequent adjustment or adaptation of the coefficients numbered 1 through m, by adding to each coefficient the product obtained by multiplying e(n) by x(n−j), the jth signal sample counting back from the present, and by $\mu$, the latter being a number selected to give the most rapid and accurate convergence of the coefficient values to a final and stable form. In practise the value of $\mu$ will be adjusted in the course of the adaptation to improve convergence.

It should be noted that to the extent that equation (1) can be said to obscure the intuitive significance of a convolution as a repeated multiplication and addition of the filter impulse response, equations (2) and (3), although simple and elegant, do not immediately suggest their profound significance. The synthesis of the filter coefficients is, in fact, a process of detecting correlations or order in the input signal, the value of the coefficients tending toward zero as the disorder of the input signal increases. The correlations will be seen to arise out of the disturbances to the test signal created by, for example, acoustic reflections from the room boundaries and contents.

As an important part of the present invention, it of course is necessary to provide a system for creating and implementing a filter complementary preferably to the greatest anomalies appearing in the test signal as perceived by a listener. To create such a filter using the adaptive linear process above-described, one processes in microcomputer 37 a sequence of N digitized test signal samples from microphone 70 as stored in RAM 100. The length of the sequence N is preferably a number small enough to permit the microcomputer to perform the processing with reasonable constraints on memory size and execution time, yet large enough to provide an accurate representation of the anomalies to be corrected. The process in effect seeks correlations introduced into the sequence by the electromechanical properties of the loudspeaker system and by acoustical phenomena such as reflections and diffractrion. This correlation information is used to produce the desired correction filter used for equalization. Alternatively, one can convolve the set of N samples in a type of cross-correlation with a target spectrum which may or may not, as desired, be functionally related to the test signal. A simplified example of the numerical process of convolution is provided hereinafter in connection with preparation of the filter, but such numerical process is substantially illustrative of the use of the filter to provide equalization as well.

In a unique method for generating the set of coefficients, adaptive linear prediction is initially performed on the N data samples with a prediction filter of M contiguous tap locations, where for example M is selected to be 128. From the generated set of coefficients, a subset is chosen, (the subset preferably being a given submultiple or M (e.g. ½ of 64), which subset contains the 64 largest or most important coefficients of the original set. All other coefficients of that subset of 64 are then set to zero and the selected set is then again subjected to the adaptive process to establish a new set of 64 coefficients. These latter in turn are compared with one another to select the next subset (32) of coefficients using the same criteria for selection. The new subset is again processed as above described and the iterative process is continued until a final filter has been designed with a desired number of non-zero coefficients. The coefficients and their respective tap locations are then stored in RAM 98 for use in correcting or equalizing the audio signal intended to be applied at terminal 20.

Figure 4A:
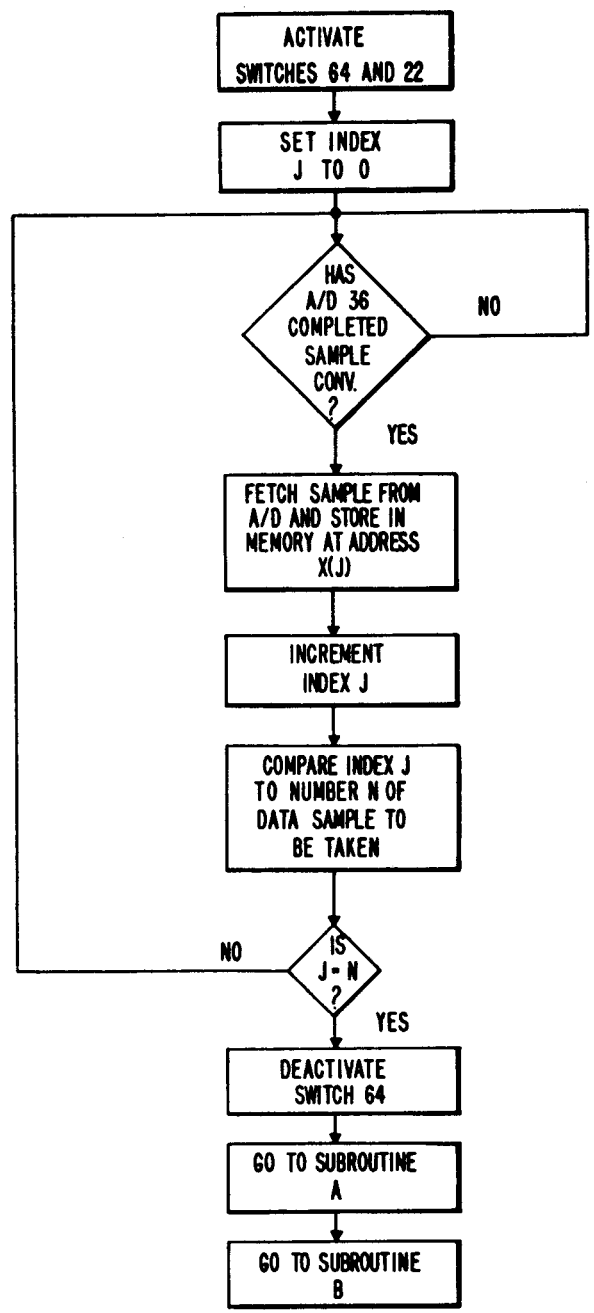
FIGS. 4A–4C are a flow chart illustrating the steps taken in generating the digital coefficients of the digital filter of the present invention.
Figure 4B:
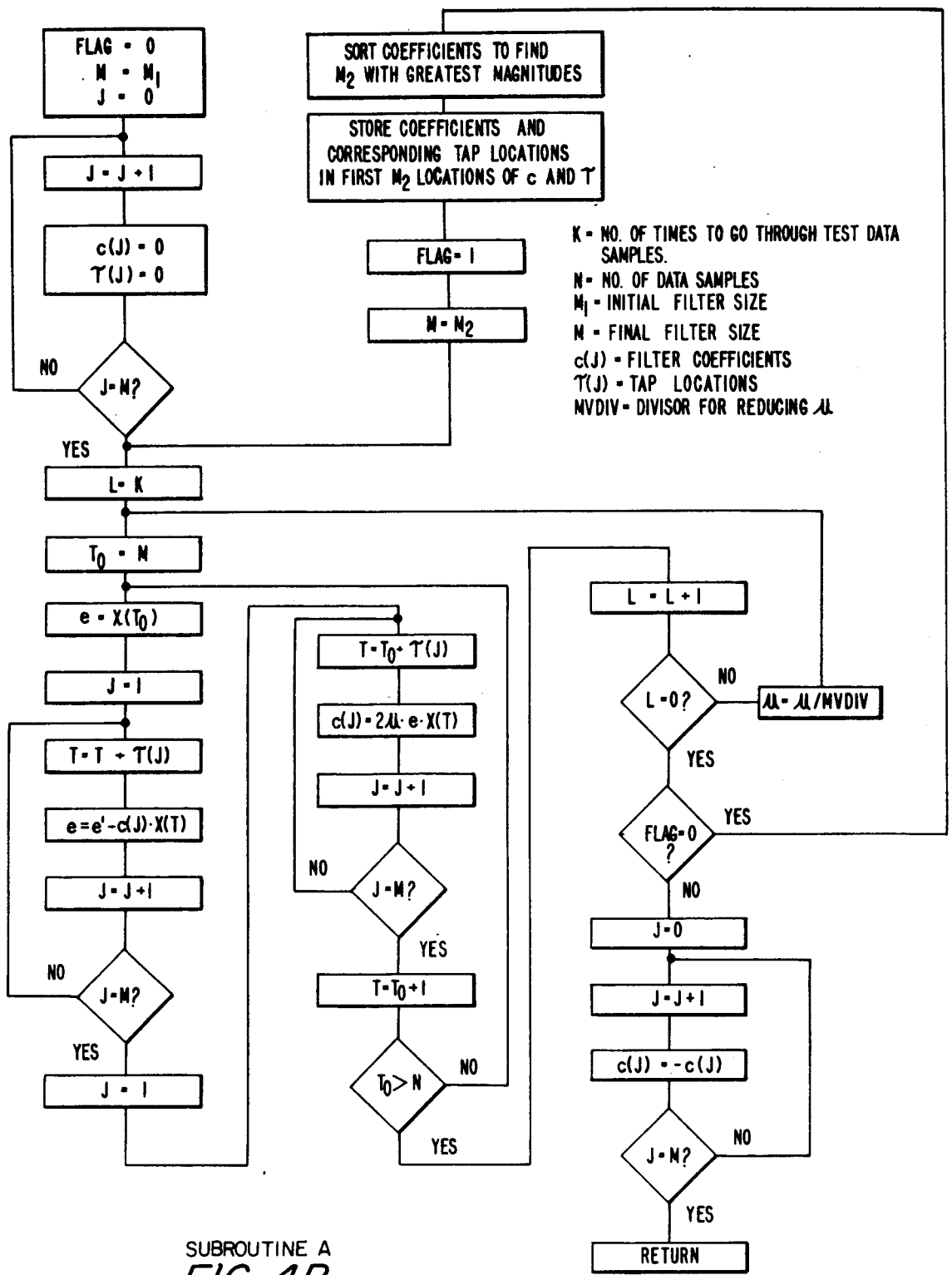
Figure 4C:
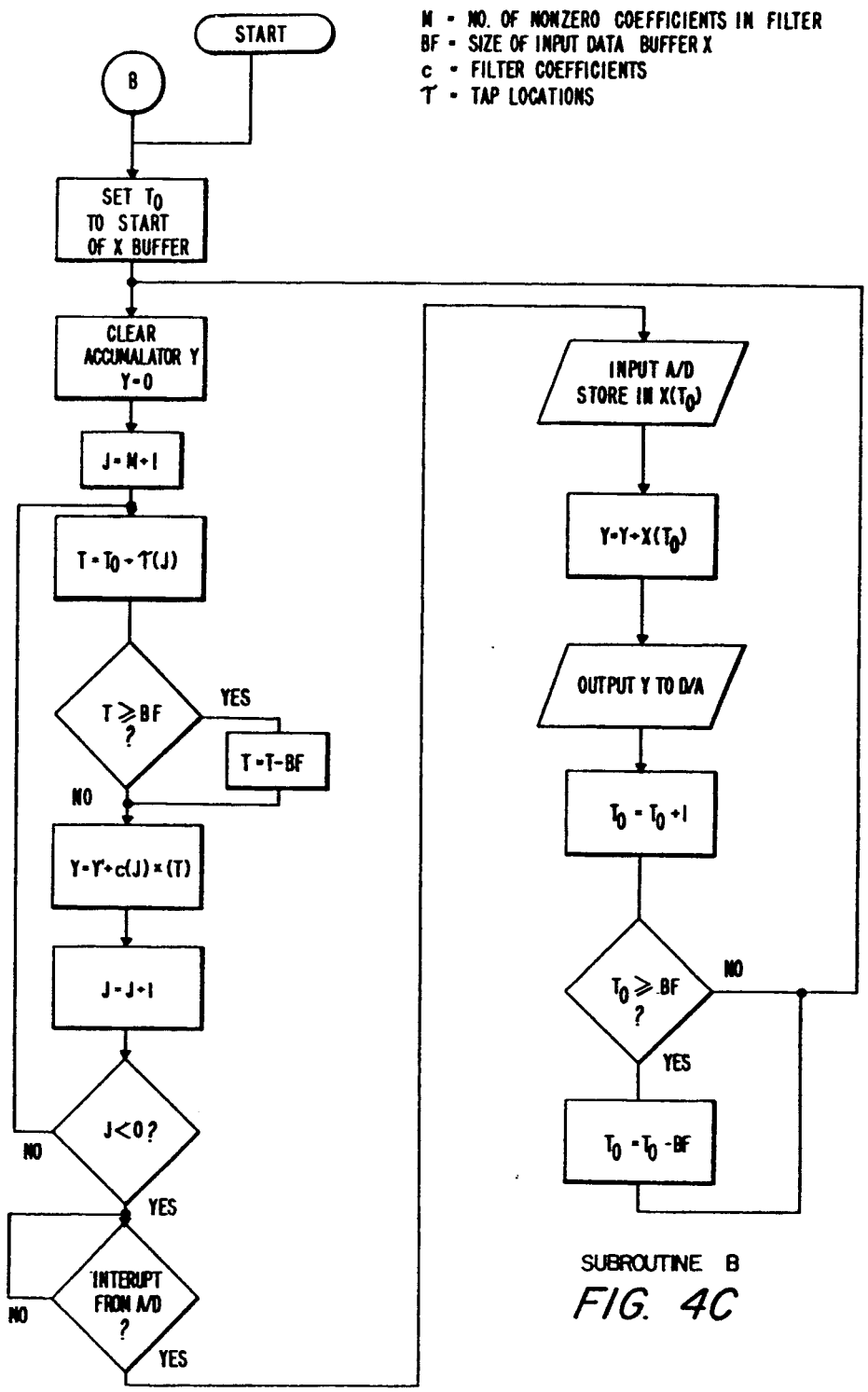

Shown in FIG. 4a, is an exemplary flow diagram from which one can readily prepare a computer program to control the operation of microcomputer 37 to effect the objects of the present invention. Subroutine A, shown in FIG. 4b, partly in Fortran notation, sets forth a flow diagram illustrating the formation of a digital filter according to the principles above described, while FIG. 4c, shows Subroutine B which is used to apply the computer filter to equalization of audio signals also as earlier described herein.

In evaluating the response of an electroacoustic system, the choice of test signal is extremely important, and this is no less true in the case of the present invention. The test signal should have as little auto-correlation as possible, and should allow the system to produce results to the desired degree of accuracy. Although a number of instruments and integrated circuits exist to generate "white" noise, which would ideally have such properties over an extended period of time, the better test signal of this kind must also take into account the length of the data upon which the filter will be based.

An optimal test signal for purposes of the present invention is a numerical sequency of the kind termed a quadratic-residue sequence, known and described in the literature of number theory by A. M. Legendre and C. F. Gauss, and also employed in acoustical applications to architectural design by M. R. Schroeder (J. Acoust. Soc. Am., 65 (4), April, 1979, "Binaural Dissimilarity and Concert Halls"). Such sequences are defined by the expression:

$$S_n = n^2 \bmod N \qquad (4)$$

where n = 1,2,3 ... and N is an odd prime, for example, 257.

As Schroeder points out, such sequences are symmetric and periodic with period N and, in addition, have a Fourier transform of constant magnitude. This latter property is what is preferred in a test signal in the system of the present invention, except that an optimum value for N is not readily apparent.

An approach to the proper selection of N is indicated by the need to include enough data samples so that the repetition rate is at least below the lowest frequency of interest. For a sampling rate of 2.0 kHz, for example, a signal band limited (theoretically) to 1.0 kHz is dictated, less in practice. A lower limit of 20 Hz would be considered reasonable for music transmission. Since one wave at 20 Hz corresponds to a period of 50 milliseconds or 100 samples, and one might allow a factor of 2 for flexibility in system design, the prime 257 would be a good candidate for N.

If the resulting series is then subjected to linear prediction analysis and further "whitened" by the application to the number series of the resulting filter, a superior test signal can be obtained. For the purpose of analysis by linear prediction, as small a sequence as possible is desired to allow as many passes through the data as can be made within the time period of the test. The value of N indicated is a good choice from this standpoint also, allowing 8 passes in a sample of only 4104 points. The formula for computing a reasonable sequence length, that is, value for N is then $$N = 2(R/f)$$

where
R is the sampling rate,
f the lowest frequency rate of interest, and
N the sequence length.

The test signal in digital form is preferably stored in target data ROM 96, and thus can be modified as desired. While that test signal optimally exhibits a uniform power spectrum, for certain purposes other target spectra may be desirable. For example, the target spectrum may be white noise or a quadratic-residue sequence modified by reflections within a specified concert hall. Production of a filter from such a target spectrum according to the present invention and convolution of that filter with an audio signal which is desired to be equalized, will endow equalization with characteristics of the audio response of that concert hall. In like manner, by selection of a particular target spectrum, the filter can be designed to alter the spectrum of an input audio signal spectrum to cause the latter to approximate virtually any type of signal spectrum desired, when reproduced by the loudspeaker of the system.

In the description earlier provided of the three stages of sound output in a reverberant room, it was noted that after the sound, energy had been equalized by prior art methods in the frequency domain, the excess high frequency energy in the attack transient portion of the sound could result in serious distortion of the sound of a musical instrument or voice. The present invention provided an especially felicitous solution to this problem by offering the user an opportunity to exclude the effect of the equalizer upon the earlier portion of the sound arriving at a specific location. The procedure to be followed is the creation of a "delayed filter" adaptive algorithm by modification of the LMS algorithm applied in the foregoing description. During execution of the adaptive algorithm, a delay time, $t_d$, is established equal to the early portion of the arriving sound as defined by the user, and the coefficient values are set to a fixed value of zero for all sample periods up to that time. Only after $t_d$ are the time and adaptation steps allowed to operate. By excluding the most recent signal samples from the adaptation process, a filter will be synthesized based only on the correlation between the present signal and signal events some time in the past, i.e. the system will ignore any correlation between recent signal information and the present value. By this technique, the developed filter will be determined entirely by detected correlation between a signal arriving at time $t_d$ and signal samples which arrived at a prior time $t_d - t'$ and earlier. Control of the duration of the excluded period can be provided by a number of simple known techniques such that the user of such an equalizer may readily select the portion of the reverberant or later arriving sound for equalization. More specifically, to overcome the problem of excess high frequency energy in the attack transient in an equalized system, and to to fulfill the objects of the invention relating to selective equalization of the diffuse sound field as distinguished from the direct field of a sound reproduction system, it is necessary to create or implement a filter with the following two properties. First, the filter should equalize out components due to the later portions of the system impulse response only, i.e. the diffuse field corresponding to reflected energy. Second, the filter should leave unaffected the early information reaching the listener, in order to maintain as nearly as possible the purity of the sound of the direct radiation from the loudspeaker. These properties can be found in a digital filter in which the "zeroth" ordinal coefficient has a value of unity, and immediately following the zeroth coefficient is a sequence of consecutive coefficients with zero cardinal values.

To achieve the desired filter, a first step prior to execution of the initial convolution is the insertion, as part of the system impulse response, of an ordinal zeroth coefficient with an assigned value which results in a corresponding zeroth coefficient of unit cardinal value in the filter derived by this method. The next step is the use of additional coefficients of cardinal value zero immediately following the zeroth coefficient, these additional coefficients replacing the same number of samples of the original impulse response which represent the time delay desired.

The purpose of each of these steps is as follows. The zero cardinal value coefficients in the leading places serve to delay any output from the filter until the arrival of the later information at the listener's location. The unity coefficient in ordinal place zero appears again in the derived filter automatically, and provides an unmodified output of the direct signal (each sample simply multiplied by 1). These features of the present invention can thus provide the user of a digital equalization system with the means for separately and accurately equalizing a chosen segment of the system impulse response. An operational system would contain a rotary dial, set of pushbuttons, or other apparatus by which the user could select an appropriate early sound time interval. Such early sound time interval is preferably specified in units of time, to indicate the start of the period when the direct radiation is first mixed with the reflected or reverberant sound when the acoustic field is thought to become diffuse, or alternatively in units of distance, where the path length of the first reflection is calculated by the user. A simple arithmetic circuit or an algorithm executed by microcomputer 37, using the numerical value of the system sampling rate, then serves to convert the user's setting of a dial (e.g. calibrated in milliseconds or meters) into an integer representing the number of early samples to be truncated or skipped, i.e., assigned cardinal values of zero. For example, a counter, inserted into the circuit of FIG. 2 to count the number of signal samples taken during some predetermined time interval by circuit 34, is preferably coupled to a control manually operable by the system user. The counter can be set to provide an inhibit signal which instructs microcomputer 37 to store a unit cardinal value for the zeroth coefficient upon count of the first sample and to permit the determination of no other coefficients for the filter until the time period set by the manual control has expired.

Figure 5A:
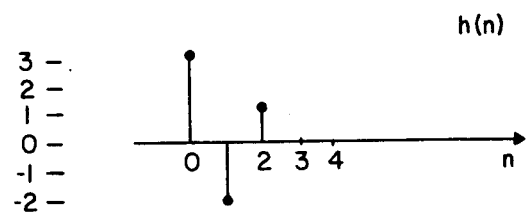
FIGS. 5A–5D are a graphical representation of the operation of a digital filter of the present invention in discriminating between a diffuse and direct field of a loudspeaker system.

As shown in FIG. 5a a simplified system impulse response h(n) is illustrated by the sequence (here merely exemplary)

$$h(n) = 3\delta(n) - 2\delta(n-1) + 1\delta(n-2) \qquad (6)$$

Figure 5B:
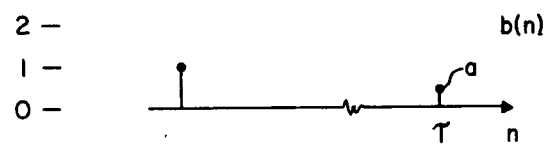

On the same graphical basis, a room impulse b(n) defined as $$b(n) = \delta(n) + a\delta(n-\tau) \qquad (7)$$

is simply here represented in FIG. 5b as the direct signal or unit sample at time zero, and a reflective spike of value a ($|a| < 1$) at a time $\tau$, $\tau$ being greater than zero. For purposes of illustration, the time delay introduced by the path distance from the acoustic source to receiver has been ignored. The response f(n) of the system in the room is obtained by convolving h(n) with b(n) as both are above defined for purposes of this example:

$$f(n) = 3\delta(n) - 2\delta(n-1) + \delta(n-2) + 1.5\delta(n-\tau) - \delta(n-\tau-1) + 0.5\delta(n-\tau-2) \qquad (8)$$

Figure 5C:
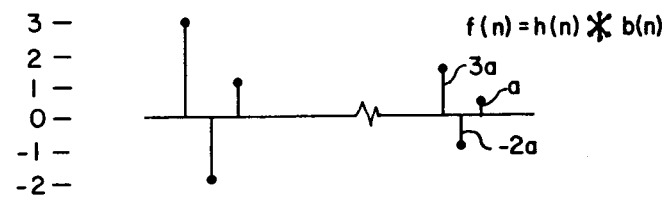

Setting a for purposes of this illustration at 0.5 then as shown in FIG. 5(c), f(n) is an early or immediate sequence with the values 3, −2, 1 representing the direct field, and a much later sequence of values 1.5, −1, 0.5 representing the diffuse field. Now, any signal X(n) passing through the system f(n) will produce an output signal:

$$y(n) = X(n) * f(n) \qquad (9)$$

An equalizer inserted into the signal path will remove the effect of the room impulse response b(n) from the signal y if the new output $$y'(n) = y(n) * g(n) = X(n) * h(n)$$

where g(n) is the impulse response of the equalizer and is such that $g(n) * b(n) = \delta(n)$.

Figure 5D:
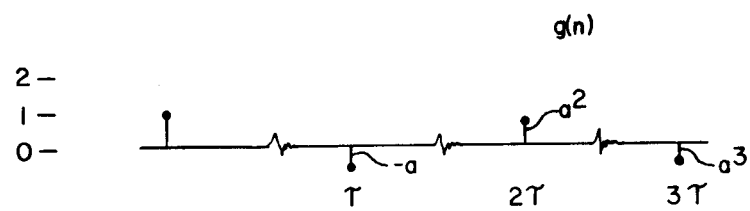

This condition may be met if g(n) is a geometric progression of infinite duration:

$$g(n) = \sum_{i=0}^{\infty} (-a)^i \delta(n - i\tau) \qquad (10)$$

as shown graphically in FIG. 5(d). As can be seen from this example, no coefficients are required before time $\tau$ in the equalizing filter's impulse response, if only the effects of reflections (diffuse field) are to be removed, but the general concept can be extended to cases of more complex room and equipment responses.

The invention may also be employed to create a filter which will convert audio spectrum B to some audio target spectrum A. For example, one may wish to restore an old recording, or provide special effects such as altering the response of a reproduction system so that a musical instrument is made to sound like a voice or vice versa, and the like. To these ends, it will be apparent that the behaviour of an adaptive LMS algorithm in the context of the present invention is to produce a filter which will maximally whiten the output of the sound reproduction system. Consequently, the introduction of a test signal with target spectrum A into an equalizer of the present invention before adaptation of the latter, i.e. for purposes of creating a filter, in accordance with the teachings hereinbefore set forth will produce an output signal with a white noise spectrum W. The transfer function of the equalizer following such adaptation then is W/A. If now one introduces into the thus adapted equalizer an input audio signal with a spectrum B, the output signal must have a spectrum characterized as BW/A. The latter signal, when used as the input test signal to another similar equalizer before adaptation of the latter, will generate a filter with a transfer function of WA/WB, or A/B. If one uses an audio signal with a spectrum B as the audio input to an equalizer with a filter having a transfer function A/B, then the output signal from that equalizer must have the characteristics of the target spectrum A.

Operation of the invention in comparison with a prior art equalization system is shown in FIG. 6 wherein there is shown in solid line, the normal frequency response of a model AR93 loudspeaker (a product of Acoustic Research, a division of Teledyne, Inc., Norwood, Mass.), the finely dotted line showing the response of the same speaker filtered by one of the better of the prior art equalization systems using fixed frequency bands, and the heavily dotted line shows the frequency response obtained by filtering according to the principles of the present invention employing a 16 coefficient filter operating between 20 Hz and 1 Khz. The advantages of the present invention, particularly in reducing the greatest deviation from a flat response are immediately apparent.

Operation of the present invention in improving the perceived response of loudspeakers generally is shown in FIG. 7 wherein FIGS. 7A, 7B and 7C are respectively illustrative of the operation of a Model L50 speaker from James B. Lansing Sound, Inc., Los Angeles, Calif., a Model 301 speaker from Bose Corp., Framingham, Mass., and a Model 105 speaker from KEF Electronics, Ltd., Kent, England. In each instance, the unfiltered response of each speaker is shown in solid line and the response following filtering according to the principles of the present invention with a 16 coefficient filter between 20 Hz and 1 KHz, is shown in broken line.

Since certain changes may be made in the above apparatus without departing from the scope of the invention herein involved, it is intended that all matter contained in the above description or shown in the accompanying drawing shall be interpreted in an illustrative and not in a limiting sense. For example, while switching of circuits has been shown in FIG. 2 to be under the control of relays or a microprocessor, it will be apparent to those skilled in the art that any switching control may be employed including manual switching if desired. Particularly, one can add other switching, for example to couple terminal 20 directly to summing device 42 so that the system can operated as an ordinary loudspeaker system without equalization. Also, one can provide selective switching to connect as desired the various RAMs and ROMs of microprocessor 37 manually instead of under control of the latter.

What is claimed is:

1. A digital discrete time filtering system for use in apparatus for modifying the audio response of at least a selected portion of a sound reproduction system with respect to analog audio signals intended to be reproduced; which apparatus includes means for introducing a test signal into said portion, and means for detecting the test signal as transmitted through said portion; said filtering system comprising in combination:
    means for generating, responsively to the detected test signal, a corresponding time-sampled sequence of values;
    digital computer means programmed for generating from said sequence, a set of digital filter coefficients for said filtering system;
    means for storing said coefficients;
    means for digitizing said audio signals;
    said digital computer means also being programmed for convolving the stored coefficients with the digitized audio signals; and
    means for converting the convolved digitized audio signals to analog form.

2. A filtering system as defined in claim 1 including an electroacoustic transducer; said means for converting being connected to feed said analog form of convolved digitized audio signal to said electroacoustic transducer.

3. Apparatus as defined in claim 2 wherein said transducer is a loudspeaker system.

4. A filtering system as defined in claim 3 including
    means for detecting at a predetermined location relative to said loudspeaker system, the acoustic output produced by said loudspeaker system responsively to said test signal.

5. A filtering system as defined in claim 4 wherein said means for detecting comprises
    microphone means for generating at its output electrical signals responsively to the detected acoustic output; and
    a communications link between the output of said microphone means and the input of said means for generating said time-sampled sequence.

6. Apparatus as defined in claim 5 wherein said link includes a broadcast portion comprising
    means for generating a radiant energy beam; and
    means for converting the electrical signals generated by said microphone means into modulation of said radiant energy beam.

7. Apparatus as defined in claim 6 wherein said means for converting said electrical signals generated by said microphone means comprises a frequency modulator.

8. Apparatus as defined in claim 6 including manually operable switching means for connecting a power source to said broadcast portion so as to initiate operation of the latter, said broadcast portion being packaged as a hand-holdable portable unit.

9. Apparatus as defined in claim 8 including said power source for providing electrical power to said broadcast portion.

10. Apparatus as defined in claim 6 further including sensor means connected to said loudspeaker means and responsive to said radiant energy beam for converting said modulations into corresponding electrical signals.

11. Apparatus as defined in claim 10 wherein said radiant energy beam is a beam of light and said sensor means is a photoelectric sensor.

12. Apparatus as defined in claim 6 wherein said means for generating said light beam comprises an LED.

13. A filtering system as defined in claim 10 including manually operable means coupled to said microphone means and communications link for initiating generation of said radiant energy beam; and
wherein said means for introducing said test signal is actuated to provide the latter responsively to detection of said radiant energy beam by said sensor means.

14. A filtering system as defined in claim 1 including means introducing said test signal as a quadratic-residue sequence ($S_n$) defined by the expression $$S_n = n^2 \bmod N$$

where
n=1,2,3 ..., and
N=an odd prime number.

15. A filtering system as defined in claim 12 wherein said means for generating said time-sampled sequence includes
means for time-sampling the detected acoustic output of said sound reproduction system;
means for determining the values of the magnitudes of such time samples; and
means for storing said values.

16. Apparatus as defined in claim 15 wherein said means for determining said values of the magnitudes of said time samples comprises
analog-to-digital conversion means, coupled to said means for time-sampling, for converting said time samples into digital signals.

17. A filtering system as defined in claim 5 including switching means for alternatively connecting the input of said means for generating said time-sampled sequence between (A) a source of said audio signals intoduced into said sound reproduction system, and (B) said communications link, to receive said electrical signals transmitted from said microphone means.

18. A filtering system as defined in claim 17 including means operative initially upon provision of said test signal, for actuating said switching means for connecting said electrical signals from said communications link to the input of said means for generating said time-sampled sequence, and operative after generation and storage of said coefficients, for actuating said switching means for connecting said source of said audio signals to said input of said means for producing said time-sampled sequence.

19. A filtering system as defined in claim 17 including analog-to-digital conversion means, coupled to said means for generating said time-sampled sequence, for converting said sequence into digital signals, and
wherein said digital computer means is also programmed for convolving said digital signals with the stored coefficients, responsively to actuation of said switching means for connecting said source of said audio signals to said input of said means for producing said time-sampled sequence, thereby filtering the digital signals produced by said analog-to-digital conversion means.

20. In an audio equalizer for a loudspeaker system in a preselected listening environment, which system includes filter means connected to the input of said loudspeaker system and adjustable for equalizing the perceived output of said loudspeaker system, means for providing an acoustical test signal at the output of said loudspeaker system, and microphone means for detecting said acoustic test signal at a predetermined location in said environment relative to said loudspeaker system, the improvement wherein
said microphone means is contained in a hand-held, battery-operated unit containing also means for generating a radiant energy beam at a frequency higher than the frequencies contained in a bandwidth over which said equalization is to occur, and means for converting the output signals generated by said microphone means into modulation of said energy beam;
said improvement also including
radiant energy sensor means connected to said loudspeaker means and responsive to said energy beam for converting said modulations into corresponding electrical signals; said filter means being a discrete-time digital filter, and said equalizer including means for generating from said electrical signals, coefficients of said digital filter.

21. An improvement in an audio equalizer as defined in claim 20, including means for converting said electrical signals to digital signals, and
said filter means includes means for convolving said digital signals with a target spectrum to generate coefficients of said discrete-time filter for said perceived output at said predetermined location.

22. An improvement in an audio equalizer as defined in claim 20 wherein
said filter means is a digital filter; and
said equalizer includes means for generating from said electrical signals, binary-encoded numerical values of the coefficients of said discrete-time filter.

23. An audio equalizer for a sound reproduction system including an electroacoustic transducer, said equalizer comprising, in combination:
a discrete-time digital filter disposed in series in a first electrical signal channel connected to feed the input of said electroacoustic transducer;
means for introducing a test signal into a first selected point in said first channel;
means for detecting at a second selected point in said first channel, the test signal as transmitted from said first to said second point;
means for producing responsively to the detected test signal, a corresponding time-sampled sequence of signals; and
means for introducing said sequence of signals into said filter;
said filter including digital computer means programmed to generate from said detected test signal, coefficients of said filter, and means for storing said coefficients.

24. An audio equalizer as defined in claim 23 including a low-pass filter disposed in said first channel for limiting transmission of said first channel to relatively low audio frequencies.

25. An audio equalizer as defined in claim 24 including a second electrical signal channel connected to feed the input of said transducer and disposed in parallel with said first channel for transmitting reltively high audio frequencies.

26. An audio equalizer as defined in claim 24 wherein said low pass filter has an upper transmission limit of about one kilohertz.

27. In a method of modifying the audio response of at least a selected portion of a sound reproduction system with respect to analog audio signals intended to be reproduced by said sound reproduction system; the improvement comprising the steps of:
   introducing a test signal into said portion,
   detecting the test signal as transmitted through said portion;
   generating, responsively to the detected test signal, a corresponding time-sampled sequence of values;
   digitally computing from said sequence, a set of digital filter coefficients;
   storing said coefficients;
   digitizing said audio signals;
   filtering said digitized audio signals by convolving the latter with the stored coefficients; and
   converting the convolved digitized audio signals to analog form.

28. Method as defined in claim 27, wherein said coefficients are computed by use of an adaptive least mean square error algorithm.

29. Method as defined in claim 28 wherein said algorithm is expressed as $$e(n) = x(n) - \sum_{j=1}^{m} c_j(n-1)x(n-j)$$

and $$cj(n) = cj(n-1) + 2\mu e(n)x(n-j)$$

wherein
   e(n) is the error signal at discrete time n,
   x(n) is the value of the test signal at discrete time n,
   cj are said filter coefficients,
   $\mu$ is a scaling coefficient;
   j is the index, and
   m is the number of coefficients in said set, and is chosen to provide sufficient resolution.

30. Method as defined in claim 27 wherein the zeroth coefficient of said coefficents is set at unity and a predetermined number of said coefficients immediately following said zeroth coefficent are set at zero, thereby to introduce a time delay into the operation of said filter.

31. Method of equalizing in a preselected listening environment, the diffuse field of a loudspeaker system relative to the direct field thereof, said method comprising the steps of
   detecting at a predetermined location in said environment relative to said loudspeaker system, the direct and diffuse fields of the acoustic output produced by said loudspeaker system responsively to a test signal;
   generating a digital signal train corresponding to the time-sampled detected acoustic output of said loudspeaker system;
   generating from said digital signals, coefficients of an adaptive linear predictive filter for said detected acoustic output, the zeroth coefficient of said coefficients being set at minus unity and a predetermined number of said coeffients immediately following said zeroth coefficient being held at zero, said predetermined number being sufficient to prevent the generation of coefficients corresponding to said detection of the direct field in said acoustic output;
   processing audio frequency electrical signals by convolving them with said coefficients of said adaptive linear predictive filter to produce equalized signals for driving said loudspeaker.

32. Apparatus for modifying the audio frequency spectrum of a first input signal to a target audio frequency spectrum of a second signal, said apparatus comprising, in combination:
   first means for modifying the audio response of a first sound reproduction system with respect to the transfer function of at least a selected portion of said first system; said first means including
   means for introducing a specific test signal with a predetermined spectrum into the input of said selected portion;
   means for detecting at the output of said selected portion, the test signal as transmitted from said input of said selected portion to said output of said selected portion;
   means for producing a first set of coefficients for first discrete-time filter means in accordance with the detected test signal;
   first discrete-time filter means for discrete-time filtering, in accordance with said first set of coefficients, said second signal to produce a signal modified in accordance with said first set of coefficients;
   said apparatus also including second means for modifying the audio response of a second sound reproduction system with respect a specific portion of said second system having the same transfer function; said second means including
   means for introducing said modified signal into the input of said specific portion;
   means for detecting at the output of said specific portion, said modified signal as transmitted from the input to the output of said specific portion;
   means for producing a second set of coefficients for second discrete-time filter means in accordance with the detected modified signal; and
   second discrete-time filter means for discrete-time filtering, in accordance with said second set of coefficients, said first input signal to produce an output signal having the spectral characteristics of said target audio frequency spectrum.

* * * * *

UNITED STATES PATENT AND TRADEMARK OFFICE
CERTIFICATE OF CORRECTION

PATENT NO. : 4,458,362

DATED : 07/03/84

INVENTOR(S) : Robert A. Berkovitz et al.

Page 1 of 2

It is certified that error appears in the above-identified patent and that said Letters Patent is hereby corrected as shown below:

Claim 3, column 20, line 32, "Apparatus" should be -- A system --;

Claim 6, column 20, line 47, "Apparatus" should be -- A system --;

Claim 7, column 20, line 53, "Apparatus" should be -- A system --;

Claim 8, column 20, line 56, "Apparatus" should be -- A system --;

Claim 9, column 20, line 61, "Apparatus" should be -- A system --;

Claim 10, column 20, line 64, "Apparatus" should be -- A system --;

Claim 11, column 21, line 1, "Apparatus" should be -- A system --;

Claim 12, column 21, line 4, "Apparatus" should be -- A system --;

UNITED STATES PATENT AND TRADEMARK OFFICE
CERTIFICATE OF CORRECTION

PATENT NO. : 4,458,362

DATED : 07/03/84

INVENTOR(S) : Robert A. Berkovitz et al.

It is certified that error appears in the above-identified patent and that said Letters Patent is hereby corrected as shown below:

Claim 13, column 21, line 7, "10" should be -- 6 --;

Claim 15, column 21, line 24, "12" should be -- 4 --;

Claim 16, column 21, line 32, "Apparatus" should be -- A system --;

Claim 29, column 23, line 34, "cj" should be -- $c_j$ --;

Claim 29, column 23, line 34, "cj(n-1)" should be -- $c_{j(n-1)}$ --;

Claim 29, column 23, line 38, "cj" should be -- $c_j$ --.

Signed and Sealed this

Fourth Day of December 1984

[SEAL]

Attest:

Attesting Officer

GERALD J. MOSSINGHOFF

Commissioner of Patents and Trademarks